United States Patent [19]
Tsuruta et al.

[11] Patent Number: 5,402,374
[45] Date of Patent: Mar. 28, 1995

[54] NON-VOLATILE SEMICONDUCTOR MEMORY DEVICE AND MEMORY CIRCUIT USING THE SAME

[75] Inventors: Masataka Tsuruta; Noriyuki Shimoji; Hironobu Nakao; Takanori Ozawa, all of Kyoto, Japan

[73] Assignee: Rohm Co., Ltd., Kyoto, Japan

[21] Appl. No.: 235,326

[22] Filed: Apr. 29, 1994

[30] Foreign Application Priority Data

Apr. 30, 1993 [JP] Japan .................. 5-104512

[51] Int. Cl.⁶ .............................................. G11C 11/34
[52] U.S. Cl. .................................... 365/185; 365/94; 365/102; 257/316; 257/319; 257/321
[58] Field of Search .................. 365/185, 900, 94, 102, 365/103, 104; 257/300, 326, 319, 321

[56] References Cited
U.S. PATENT DOCUMENTS 5,274,586 12/1993 Matsukawa .................. 365/185
5,313,427 5/1994 Schreck et al. .................. 365/185
5,338,954 8/1994 Shimoji .................. 257/316
5,345,104 9/1994 Prall et al. .................. 257/316

*Primary Examiner*—Joseph A. Popek
*Assistant Examiner*—Tan Nguyen
*Attorney, Agent, or Firm*—Steven M. Rabin

[57] ABSTRACT

In the non-volatile semiconductor memory device according to the present invention, a floating gate is provided on a channel region which is interposed between a source region and a drain region through a tunnel insulation film. The tunnel insulation film and the floating gate are formed spaced apart from the source region by a predetermined offset distance. A sidewall gate which is insulated from the channel region and the floating gate is provided in an offset distance portion on the channel region. An offset region immediately under the sidewall gate functions as an inversion layer, thereby to make it possible to read out information at high speed utilizing the inversion of the offset region.

8 Claims, 14 Drawing Sheets

NON-VOLATILE SEMICONDUCTOR MEMORY DEVICE AND MEMORY CIRCUIT USING THE SAME

BACKGROUND OF THE INVENTION

1. Field of the Invention

The present invention relates to a non-volatile semiconductor memory device and a non-volatile memory circuit using the same.

2. Description of the Prior Art

In recent years, the integration density of a non-volatile memory semipermanently storing information has been required with the development of the semiconductor industry. In order to meet this requirement, it is considered that the integration density of a memory cell circuit is improved.

Therefore, a non-volatile memory having a one transistor cell structure has been conventionally proposed. FIG. 9 is a diagram of an equivalent circuit showing the electrical construction of a conventional non-volatile memory. In this non-volatile memory, memory cells 2A, 2B, 2C and 2D which are respectively constituted by memory transistors 1A, 1B, 1C and 1D having floating gates FG are arranged in a matrix in the column direction X and the row direction Y.

A word line WL1 is connected to respective control gates of the memory transistors 1A and 1B arranged in the column direction X, and a word line WL2 is connected to respective control gates of the memory transistors 1C and 1D arranged in the column direction X. A bit line BL1 is connected to respective drains of the memory transistors 1A and 1C arranged in the row direction Y, and a bit line BL2 is connected to respective drains of the memory transistors 1B and 1D arranged in the row direction Y. In addition, a common source line S is connected to respective sources of the memory transistors 1A, 1B, 1C and 1D, and a common substrate line SUB is connected to respective substrates of the memory transistors 1A, 1B, 1C and 1D.

Referring to FIG. 9, description is made of the operation of writing information to the above described non-volatile memory. For example, it is assumed that information is written to the memory cell 2A. At this time, a voltage of 0 V is applied to the source line S and the substrate line SUB, a voltage of 10 V is applied to the word line WL1 to which the memory cell 2A is connected, and a voltage of 6 V is applied to the bit line BL1 to which the memory cell 2A is connected. On the other hand, a voltage of 0 V is applied to the word line WL2 to which the non-selected memory cells 2C and 2D are connected, and the bit line BL2 to which the non-selected memory cells 2B and 2D are connected is brought into an open state.

Consequently, charges are injected into the floating gate FG of the memory transistor 1A, so that the memory cell 2A is brought into an information written state.

FIG. 10 is a schematic cross sectional view showing the construction of a memory transistor 1 constituting each of the memory cells 2A to 2D in FIG. 9. Referring to FIG. 10, the memory transistor 1 comprises a P-type silicon substrate 10, an N+-type source region 10b and an N+-type drain region 10c formed spaced apart from each other by a predetermined distance on a surface layer of the silicon substrate 10, a tunnel oxide film 11 formed on a channel region 10a so formed as to be interposed between the source region 10b and the drain region 10c, a floating gate 12 formed on the tunnel oxide film 11, an ONO (oxide nitride oxide) film 13 formed on the floating gate 12, and a control gate 14 formed on the ONO film 13.

At the time of writing information, a voltage of 0 V is applied to the source region 10b and the substrate 10 of the memory transistor 1, respectively, a voltage of 10 V is applied to the control gate 14 thereof, and a voltage of 6 V is applied to the drain region 10c thereof, a saturated channel current flows between a source and a drain. In a pinch off region in the vicinity of the drain region 10c, electrons accelerated by a high electric field is impactionized, to generate electrons having high energy, that is, so-called hot electrons. The hot electrons are injected into the floating gate 12 after passing through the tunnel oxide film 11 by tunneling. Consequently, the writing of information is achieved.

In the above described conventional non-volatile memory, electrons are injected into the floating gate of the memory transistor in writing information. In this case, the electrons accelerated are caused to collide with silicon in the vicinity of the drain by increasing a write current, to generate hot electrons, and the hot electrons are locally injected into the floating gate. Therefore, the tunnel oxide film is locally degraded, thereby decreasing the number of times of rewriting.

Furthermore, it takes long for the electrons to be stored in the entire floating gate due to the local writing, thereby to make it impossible to write information instantaneously.

Additionally, a write disturbance may, in some cases, occur in the non-selected memory cell at the time of writing. For example, when the memory cell 2A is selected as a write cell in FIG. 9, a voltage of 0 V and a voltage of 6 V are respectively applied to the control gate 14 and the drain region 10c of the memory transistor 1C, as shown in FIG. 11, in the non-selected memory cell 2C sharing the bit line BL1 with the memory cell 2A. This may, in some cases, cause a drain disturbance. More specifically, the memory transistor 1C shall be in a state where information is written, that is, a state where electrons are stored in the floating gate 12. Consequently, the electrons stored in the floating gate 12 are emitted to the drain region 10c by the application of the above described voltages. As a result, the information in the memory transistor 1C is destroyed.

On the other hand, in the non-selected memory cell 2B sharing the word line WL1 with the selected memory cell 2A, a voltage of 10 V and a voltage of 0 V are respectively applied to the control gate 14 and the substrate 10 of the memory transistor 1B, as shown in FIG. 12. This may, in some cases, cause a gate disturbance. More specifically, the memory transistor 1B shall be in a state where no information is written, that is, a state where no electrons are stored in the floating gate 12. Consequently, an FN (Fowler-Nordheim) tunnel current is produced due to a potential difference between the substrate 10 and the control gate 14 by the application of the above described voltages, and the electrons are injected into the floating gate 12 by the FN tunnel current. As a result, information is erroneously written to the memory transistor 1B.

SUMMARY OF THE INVENTION

In view of the foregoing, an object of the present invention is to provide a non-volatile semiconductor memory device capable of:

a) increasing the number of times of rewritability;

b) instantaneously rewriting information; and
c) preventing a write disturbance (a drain disturbance and/or a gate disturbance) at the time of writing information, and a non-volatile memory circuit using the same.

In the non-volatile semiconductor memory device according to the present invention, a floating gate is provided on a channel region which is interposed between a source region and a drain region through a tunnel insulation film. The tunnel insulation film and the floating gate are formed spaced apart from the source region by a predetermined offset distance. A sidewall gate which is insulated from the channel region and the floating gate is provided in an offset distance portion on the channel region. An offset region immediately under the sidewall gate functions as an inversion layer, thereby to make it possible to read out information at high speed utilizing the inversion of the offset region.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
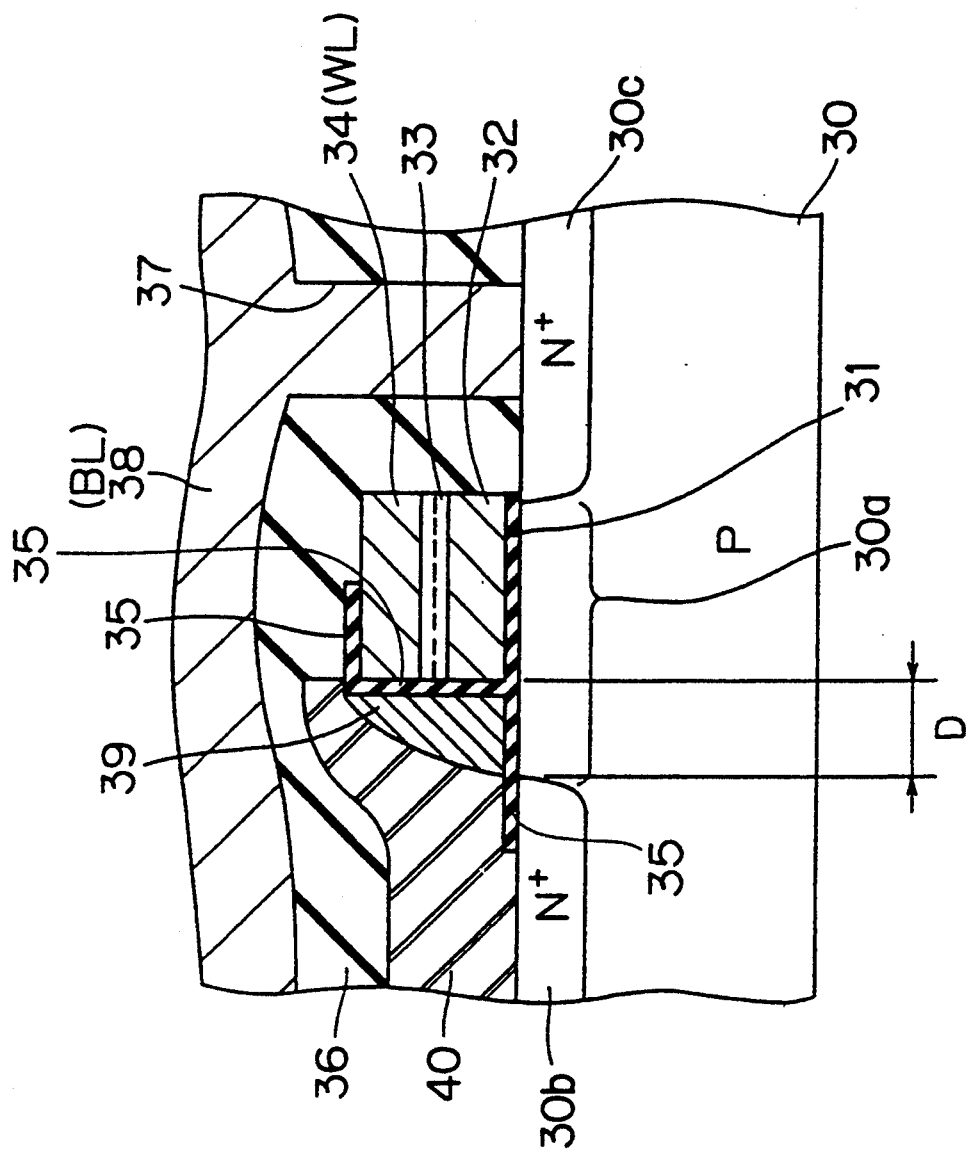
FIG. 1 is a schematic cross sectional view showing the construction of a non-volatile memory device according to one embodiment of the present invention.

FIG. 1 is a schematic cross sectional view showing the construction of a non-volatile memory device according to one embodiment of the present invention, which illustrates a state where a passivation film is stripped.

Referring to FIG. 1, a non-volatile memory device according to the present embodiment comprises a P-type silicon substrate 30, an N+-type source region 30b and an N+-type drain region 30c which are formed spaced apart from each other by a predetermined distance on a surface layer of the silicon substrate 30, a tunnel oxide film 31 formed spaced apart from the source region 30b by a predetermined offset distance D on a channel region 30a so formed as to be interposed between the source region 30b and the drain region 30c, a floating gate 32 formed on the tunnel oxide film 31, a capacitor insulation film 33 formed on the floating gate 32, a control gate 34 (WL) formed on the capacitor insulation film 33, a sidewall gate 39 formed on the remaining region of the channel region 30a, and a source electrode 40 brought into contact with the source region 30b and connected to the sidewall gate 39. The non-volatile memory device stores information by injecting charges into the floating gate 32 and extracting the charges injected.

Charges produced in the channel region 30a can pass through the tunnel oxide film 31 by tunneling. The tunnel oxide film 31 is composed of $SiO_2$, and the thickness thereof is made significantly small so that charges can pass therethrough by tunneling.

The floating gate 32 is composed of polysilicon whose resistance is decreased by doping phosphorus, for example, at a high concentration.

The capacitor insulation film 33 is required to close charges in the floating gate 32 for a long time. The capacitor insulation film 33 has a so-called ONO (oxide nitride oxide) structure in which an $Si_3N_4$ film is sandwiched between upper and lower $SiO_2$ films. The capacitor insulation film 33 shall be hereinafter referred to as an ONO film 33.

The control gate 34 is composed of polysilicon whose resistance is decreased by doping phosphorous, for example, at a high concentration, similarly to the floating gate 32.

The sidewall gate 39 is composed of polysilicon whose resistance is decreased by doping phosphorous, for example, at a high concentration. A high dielectric insulation film 35 is interposed between the sidewall gate 39 and the channel region 30a and between the sidewall gate 39 and respective portions of the floating gate 32, the ONO film 33 and the control gate 34 on the side of the source region 30b. The high dielectric insulation film 35 is composed of $SiO_2$, and the thickness thereof is so set that an FN tunnel current produced in the channel region 30a does not pass therethrough, as described later.

The source region 40 is composed of a conductive material such as tungsten polyside.

Furthermore, the entire upper surface is covered with an interlayer insulation film 36 composed of BPSG (boron phosfied silicon glass). Therefore, the floating gate 32 is not connected to the exterior. A contact hole 37 is opened to a portion, which corresponds to the drain region 30c, of the interlayer insulation film 36. A bit line 38 (BL) composed of an Al—Si alloy or the like is brought into contact with the drain region 30c through the contact hole 37.

FIGS. 2A to 2L are schematic cross sectional views showing the sequential steps of a method of fabricating the non-volatile memory device shown in FIG. 1. Referring to FIGS. 2A to 2L, description is made of the method of fabricating the non-volatile memory device.

Figure 2A:
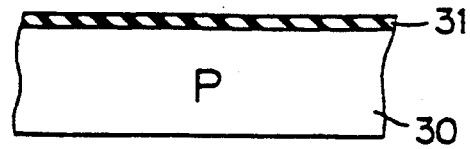
FIGS. 2A, 2B, 2C, 2D, 2E, 2F, 2G, 2H, 2I, 2J, 2K and 2L are schematic cross sectional views showing the sequential steps of a method of fabricating the non-volatile memory device shown in FIG. 1.
Figure 2B:
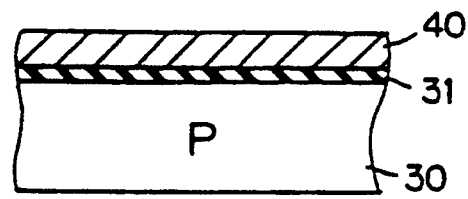
Figure 2C:
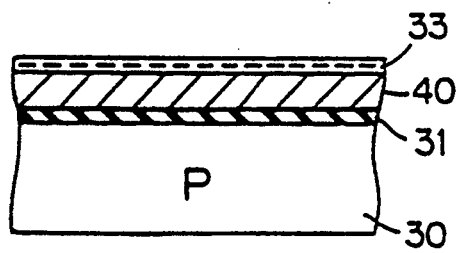
Figure 2D:
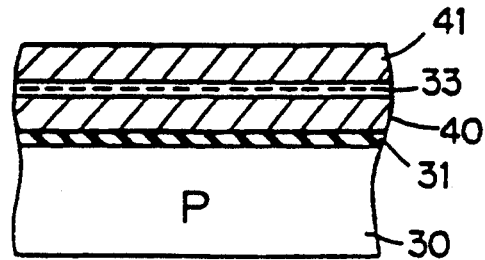
Figure 2E:
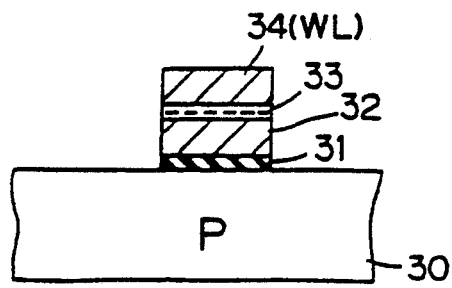

First, a gate is formed. Specifically, as shown in FIG. 2A, a tunnel oxide film 31 composed of $SiO_2$ having a thickness of approximately 100 Å is formed on a P-type silicon substrate 30 by thermal oxidation. Thereafter, as shown in FIG. 2B, a polysilicon film 40 is deposited on the tunnel oxide film 31 by, for example, the LPCVD (low pressure chemical vapor deposition) process and then, phosphorous is doped into the polysilicon film 40 so as to provide conductivity. As shown in FIG. 2C, $SiO_2$ having a thickness of approximately 60 Å, $Si_3N_4$ having a thickness of approximately 110 Å and $SiO_2$ having a thickness of approximately 60 Å, for example, are then sequentially laminated on the polysilicon film 40, to form an ONO film 33. Thereafter, as shown in FIG. 2D, a polysilicon film 41 is deposited on the ONO film 33 by, for example, the LPCVD process and then, phosphorous is doped into the polysilicon film 41 so as to provide conductivity. As shown in FIG. 2E, the polysilicon film 41, the ONO film 33, the polysilicon film 40 and the tunnel oxide film 31 are removed, leaving necessary portions, by the photolithographic technique, to form a floating gate 32 and a control gate 34 (WL).

Figure 2F:
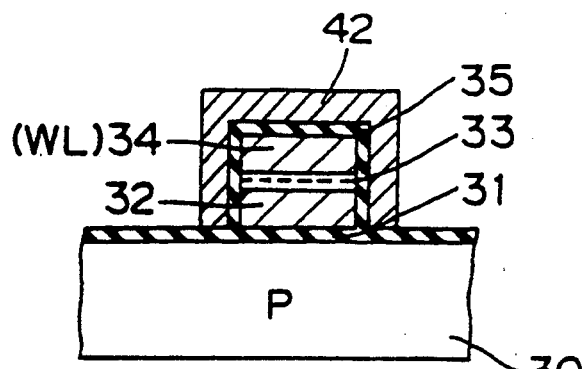
Figure 2G:
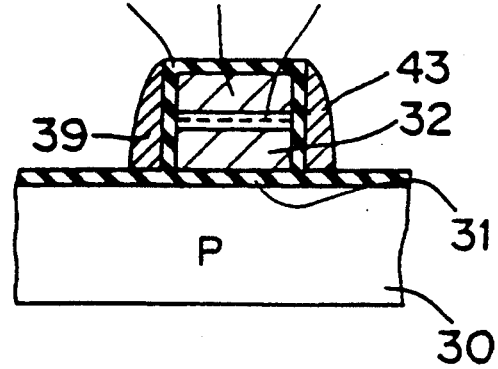
Figure 2H:
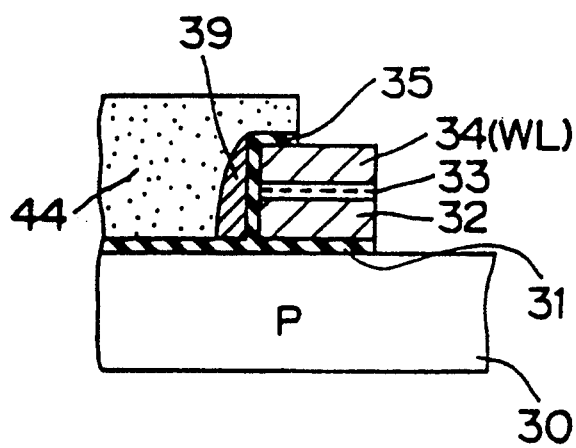

When the above described gate forming step is terminated, a sidewall gate is formed. Specifically, as shown in FIG. 2F, a thin $SiO_2$ film is grown by thermal oxidation, to surround the tunnel oxide film 31, the floating gate 32, the ONO film 33 and the control gate 34 by a high dielectric insulation film 35. It is preferable that the thickness of the high dielectric insulation film 35 is, for example, approximately 300 Å. Subsequently, a polysilicon film 42 is deposited on the high dielectric insulation film 35 by the LPCVD process, and phosphorous is doped into the polysilicon film 42. Thereafter, as shown in FIG. 2G, a part of the polysilicon film 42 is removed by etch back until the high dielectric insulation film 35 on the control gate 34 is exposed, to form a pair of sidewall gates 39 and 40 on both sides of the floating gate 32, the ONO film 33 and the control gate 34. As shown in FIG. 2H, a resist 44 is then applied so as to cover the sidewall gate 39 on one side (on the left side in the drawing) and then, the high dielectric insulation film 35 and the sidewall gate 43 on the other side are removed by anisotropic etching such as dry etching, to expose a part of the surface of the substrate 30. The remaining sidewall gate 39 functions as a mask for forming the above described offset region. At this time, the width of the sidewall gate 39 is controlled depending on the thicknesses of the polysilicon film 42, the floating gate 32, the ONO film 33 and the control gate 34.

Figure 2I:
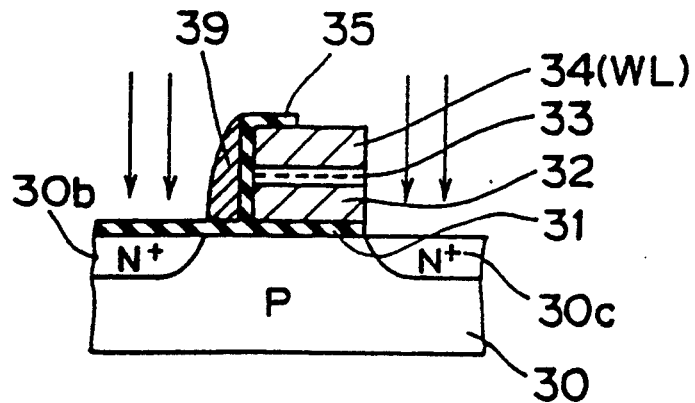

If the above described sidewall gate forming step is terminated, a source region and a drain region are formed. Specifically, as shown in FIG. 2I, the resist 44 is removed and then, phosphorous is ion-implanted by, for example, implantation utilizing as masks the floating gate 32, the ONO film 33, the control gate 34 and the sidewall gate 39, to form an $N^+$-type source region 30b and an $N^+$-type drain region 30c on a surface layer of the P-type silicon substrate 30 in a self-alignment manner. In this step, an offset distance between the floating gate 32 and the source region 30b is controlled by the width of the sidewall gate 39. It is preferable that the width of the sidewall gate 39 is approximately 0.2 to 0.3 μm.

Figure 2J:
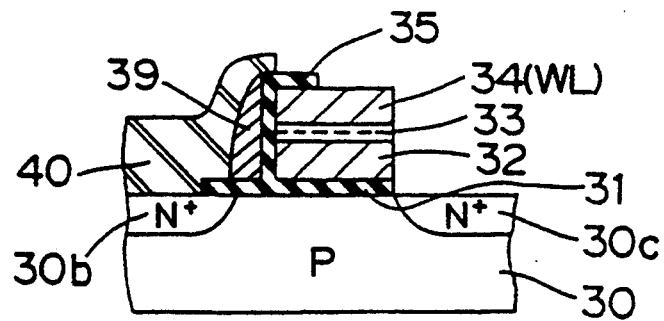

If the above described source region and drain region forming step is terminated, a source electrode is formed. Specifically, as shown in FIG. 2J, an opening is provided in a portion, which corresponds to the source region 30b, of the high dielectric insulation film 35 and then, tungsten polyside is deposited by, for example, the PVD (physical vapor deposition) process, to bring the source electrode 40 into contact with the source region 30b as well as to connect the source electrode 40 to the sidewall gate 39.

Figure 2K:
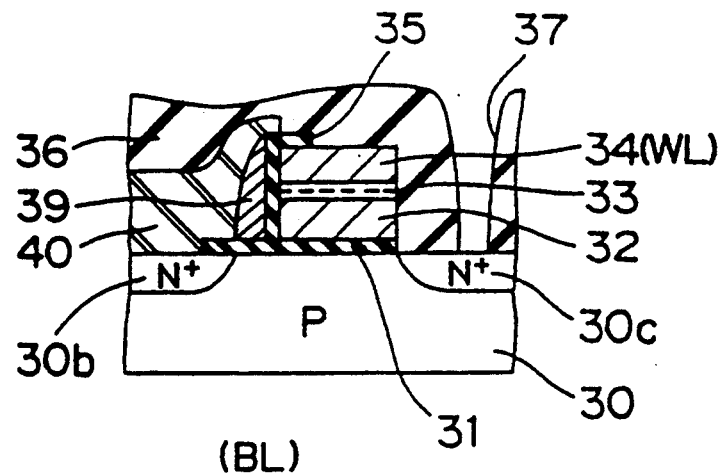
Figure 2L:
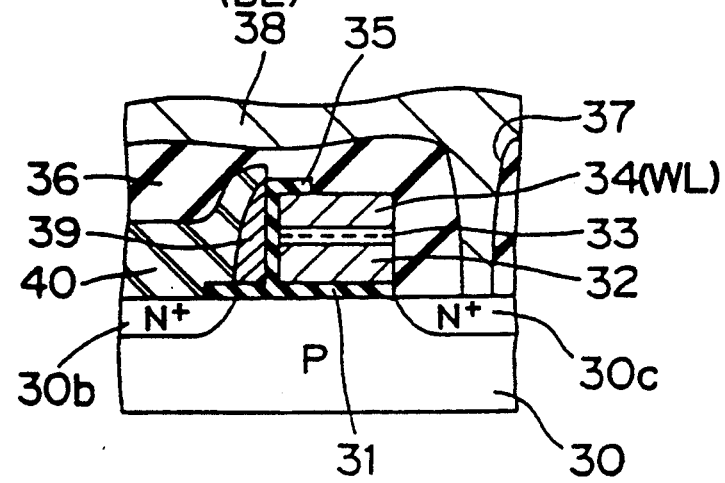

If the above described source electrode forming step is terminated, an interlayer insulation film is formed and is metallized. Specifically, as shown in FIG. 2K, BPSG is deposited on the entire surface to form the interlayer insulation film 36 by, for example, the CVD process. Thereafter, a contact hole 37 is formed in a portion, which corresponds to the drain region 30c, of the interlayer insulation film 36. As shown in FIG. 2L, a conductive material such as an Al—Si alloy is deposited on the interlayer insulation film 36 by, for example, the PVD process, to bring a bit line 38 (BL) into contact with the drain region 30c through the contact hole 37. Thereafter, the entire surface is covered with a passivation film, which is not illustrated.

In the above described sidewall gate forming step (the step shown in FIGS. 2F and 2G), the polysilicon film 42 is deposited in such a shape as to surround the floating gate 32 and the control gate 34 and then, a part of the polysilicon film 42 is removed, to form the sidewall gate 39. Accordingly, the width of the sidewall gate 39 is controlled depending on the thicknesses of the polysilicon film 42, the floating gate 32, the ONO film 33 and the control gate 34. Therefore, it is easy to control the width of the sidewall gate 39.

Furthermore, in the diffusion layer forming step (the step shown in FIGS. 2H and 2I), the source region 30b and the drain region 30c are formed in a self-alignment manner utilizing as masks the floating gate 32, the ONO film 33, the control gate 34 and the sidewall gate 39. Accordingly, an offset distance D between the floating gate 32 and the source region 30b can be set with high precision.

Figure 3:
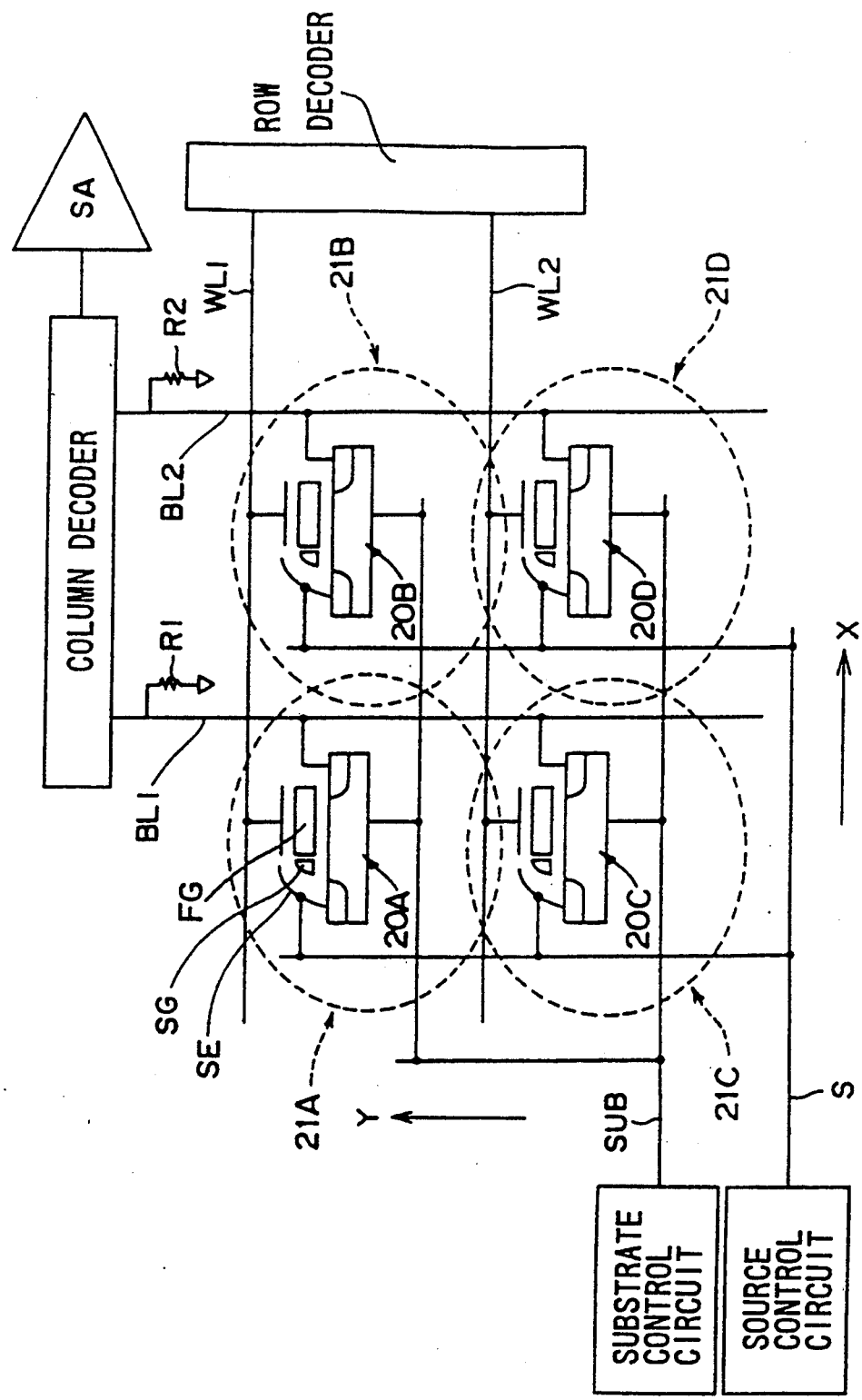
FIG. 3 is a diagram of an electrical equivalent circuit showing the construction of a non-volatile memory using the non-volatile memory device shown in FIG. 1.

FIG. 3 is a diagram of an electrical equivalent circuit showing the construction of a non-volatile memory using the above described non-volatile memory device as a memory transistor.

Referring to FIG. 3, the non-volatile memory comprises memory cells 21A, 21B, 21C and 21D respectively using the non-volatile memory device shown in FIG. 1 as memory transistors 20A, 20B, 20C and 20D. The memory cells 21A, 21B, 21C and 21D are arranged in a matrix in the column direction X and the row direction Y.

A word line WL1 is connected to respective control gates of the memory transistors 20A and 20B constituting the memory cells 21A and 21B arranged in the column direction X. A word line WL2 is connected to respective control gates of the memory transistors 20C and 20D constituting the memory cells 21C and 21D arranged in the column direction X.

A bit line BL1 is connected to respective drains of the memory transistors 20A and 20C constituting the memory cells 21A and 21C arranged in the row direction Y. A bit line BL2 is connected to respective drains of the memory transistors 20B and 20D constituting the memory cells 21B and 21D arranged in the row direction Y.

Furthermore, a common source line S is connected to respective source electrodes SE of the memory transistors 20A, 20B, 20C and 20D, and a common substrate line SUB is connected to respective substrates of the memory transistors 20A, 20B, 20C and 20D.

A column decoder is connected to the bit lines BL1 and BL2. The column decoder applies predetermined voltages to the bit lines BL1 and BL2, respectively, at the time of writing, erasing and reading out information. A sense amplifier for detecting the potential change of the bit line at the time of reading out information is connected to the column decoder. In FIG. 3, R1 and R2 denote resistors.

A row decoder is connected to the word lines WL1 and WL2. The row decoder applies predetermined voltages to the word lines WL1 and WL2, respectively, at the time of writing, erasing and reading out information.

A source control circuit is connected to the source line S. The source control circuit applies a predetermined voltage to the source line S at the time of writing, erasing and reading out information.

A substrate control circuit is connected to the substrate line SUB. The substrate control circuit applies a predetermined voltage to the substrate line SUB at the time of writing, erasing and reading out information.

Table 1 shows one example of voltages applied to the respective lines in respective operations of writing, reading out and erasing information in the non-volatile memory. Further, FIGS. 4, 5 and 6 are illustrations of the respective operations of writing, reading out and erasing information.

TABLE 1

|  | BL 1 | BL 2 | WL 1 | WL 2 | S | SUB |
|---|---|---|---|---|---|---|
| writing | 0 V | 7 V | 10 V | 0 V | 0 V | 0 V |
| erasing | open | open | 0 V | 0 V | open | 10 V |
| reading | 0 V | open | 5 V | 0 V | 2 V | 0 V |

Figure 4:
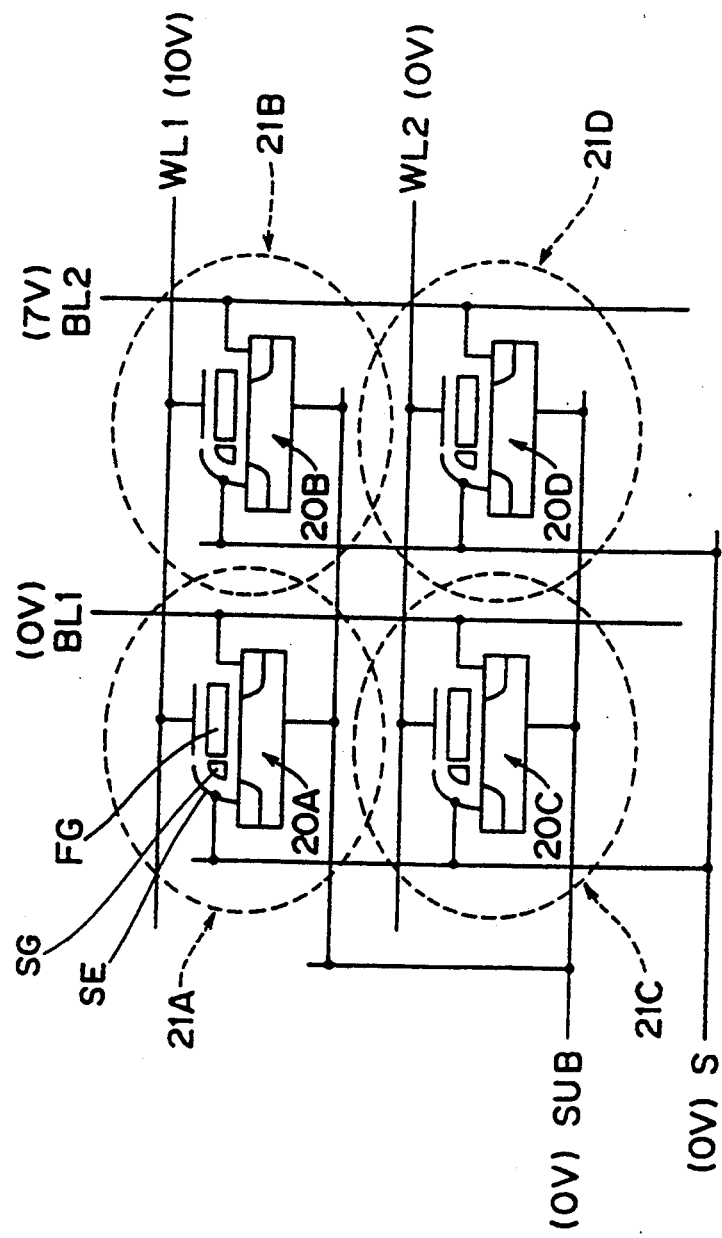
FIG. 4 is a diagram of an equivalent circuit showing applied voltages at the time of writing in the memory shown in FIG. 3.
Figure 5:
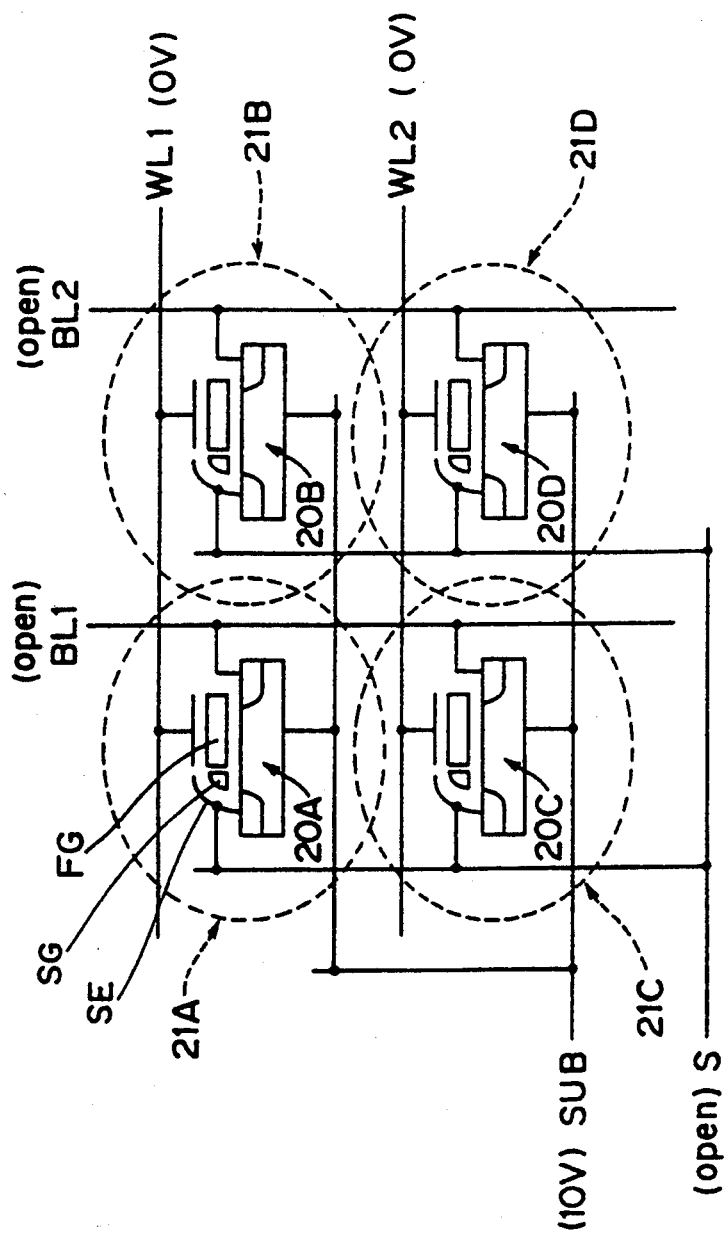
FIG. 5 is a diagram of an equivalent circuit showing applied voltages at the time of erasing in the memory shown in FIG. 3.
Figure 6:
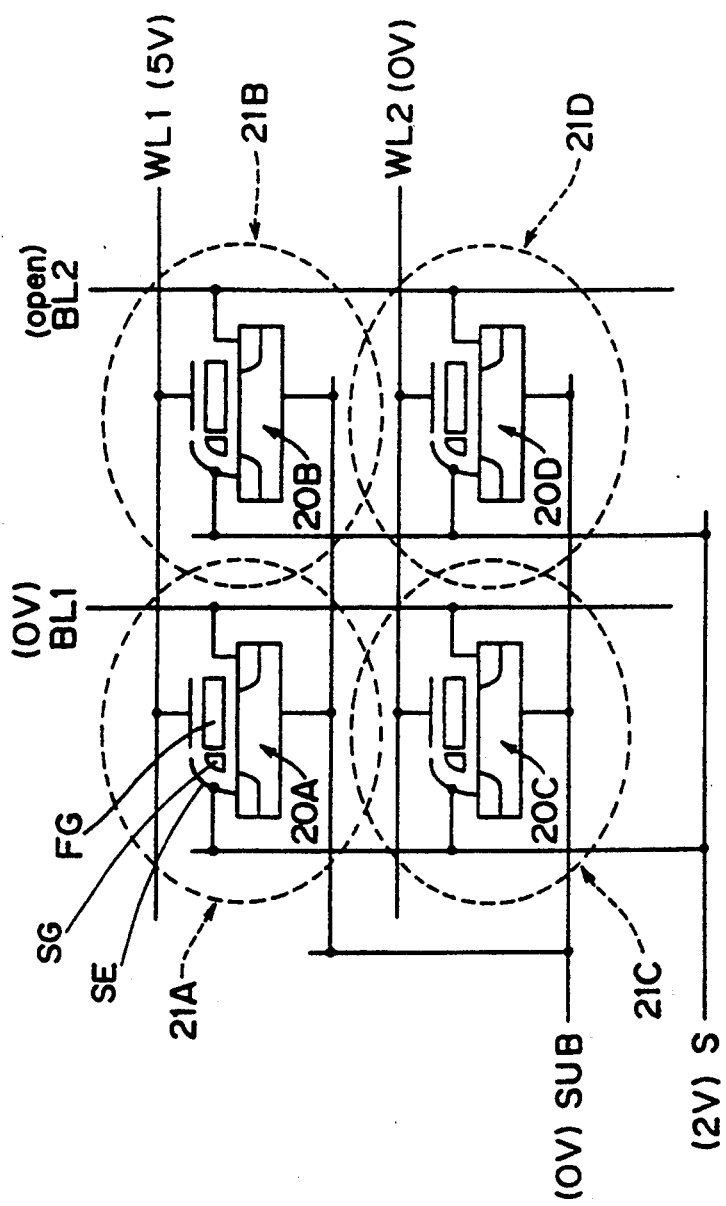
FIG. 6 is a diagram of an equivalent circuit showing applied voltages at the time of reading in the memory shown in FIG. 3.

Referring to Table 1 and FIGS. 4, 5 and 6, description is made of the operations of the non-volatile memory.

[Writing]

FIG. 4 is a diagram of an equivalent circuit showing situations where voltages are applied to the non-volatile memory at the time of writing.

For example, it is assumed that information is written to the memory cell 21A. First, a voltage of 0 V is applied to the source line S by the source control circuit, and a voltage of 0 V is applied to the substrate line SUB by the substrate control circuit. A voltage of 10 V is applied to the word line WL1 to which the selected memory cell 21A is connected by the row decoder, and a voltage of 0 V is applied to the bit line BL1 to which the selected memory cell 21A is connected by the column decoder so as to select the memory cell 21A. In addition, a voltage of 0 V is applied to the word line WL2 to which the non-selected memory cells 21C and 21D are connected by the row decoder, and a voltage of 7 V is applied to the bit line BL2 to which the non-selected memory cells 21B and 21D are connected by the column decoder.

Consequently, in the selected memory cell 21A, an FN tunnel current is produced between the substrate and the control gate (hereinafter referred to as "gate") of the memory transistor 20A, and electrons are injected into the floating gate FG by the FN tunnel current. As a result, the selected memory cell 21A enters a state where information is written. On the other hand, in the non-selected memory cells 21B, 21C and 21D, no FN tunnel current is produced between the substrates and the gates of the memory transistors 20B, 20C and 20D, and no electrons are injected into the floating gates FG. As a result, no information is written to the non-selected memory cells 21B, 21C and 21D.

The principle of the operations of the respective memory transistors at the time of writing will be described in more detail with reference to FIGS. 7A, 7B and 7C.

Figure 7A:
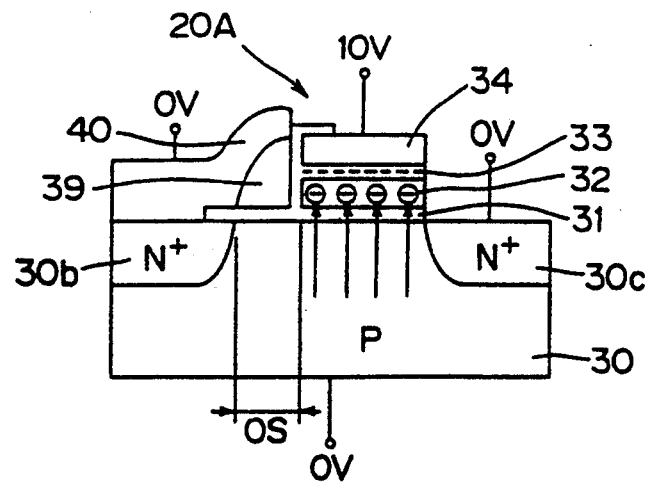
FIGS. 7A, 7B and 7C are diagrams showing the principle of an operation of the non-volatile memory device at the time of writing.
Figure 7B:
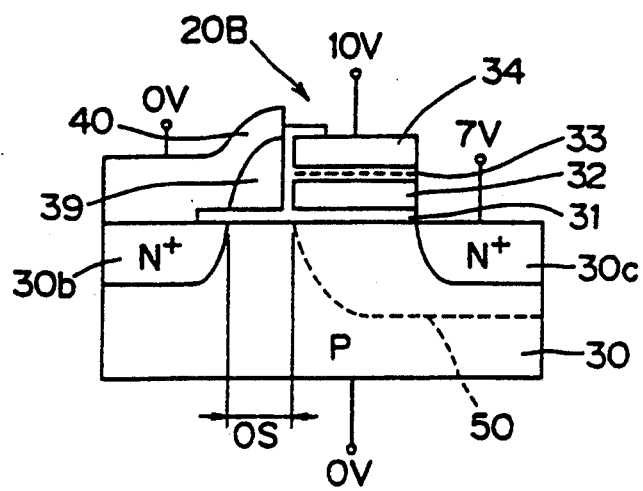
Figure 7C:
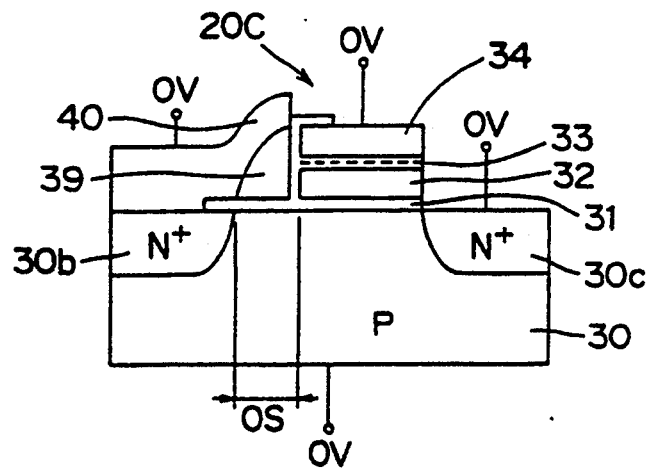

FIGS. 7A, 7B and 7C respectively show the states of the memory transistors 20A, 20B and 20C. In each of the memory transistors, the floating gate 32 is disposed spaced apart from the source region 30b by a predetermined offset distance, and a voltage of 0 V is applied to the source region 30b, so that a channel region immediately under the sidewall gate 39 is always an offset region OS.

In the selected memory cell 21A, a voltage of 10 V, a voltage of 0 V and a voltage of 0 V are respectively applied to the control gate 34, the substrate 30 and the drain region 30c of the memory transistor 20A. Accordingly, an FN tunnel current is produced between the substrate 30 and the gate 34, and electrons are injected into the floating gate 32 after passing through the tunnel oxide film 31 by the FN tunnel current.

In the non-selected memory cell 21B sharing the word line WL1 with the selected memory cell 21A, a voltage of 10 V and a voltage of 0 V are respectively applied to the control gate 34 and the substrate 30 of the memory transistor 20B, as shown in FIG. 7B, so that a potential difference arises between the substrate 30 and the gate 34. However, a voltage of 7 V is applied to the drain region 30c of the memory transistor 20B. Accordingly, a depletion layer 50 of a PN junction portion of the drain region 30c spreads to the boundary of the offset region OS. This depletion layer 50 interrupts the FN tunnel current. Therefore, no electrons are injected into the floating gate 32 by the FN tunnel current, so that no gate disturbance occurs.

Furthermore, in the non-selected memory cell 21C sharing the bit line BL1 with the selected memory cell 21A, a voltage of 0 V is respectively applied to the control gate 34, the drain region 30c and the substrate 30 of the memory transistor 20C, as shown in FIG. 7C, so that the memory transistor 20C is not operated. Accordingly, no drain disturbance occurs in the non-selected memory cell 21C. Specifically, when information is written to the memory cell 21C, electrons stored in the floating gate 32 of the memory transistor 20C are not emitted to the drain region 30c, so that the information written is not destroyed.

[Erasing]

FIG. 5 is a diagram of an equivalent circuit showing situations where voltages are applied to the non-volatile memory at the time of erasing. Informations are collectively erased. First, all the bit lines BL1 and BL2 and the source line S are brought into an open state by the column decoder and the source control circuit, and a voltage of 10 V is applied to the substrate line SUB by the substrate control circuit, and a voltage of 0 V is applied to all the word lines WL1 and WL2 by the row decoder.

Consequently, a bias opposite to that at the time of writing information is applied to the respective areas between the substrates and the gates of all the memory transistors 20A, 20B, 20C and 20D, so that electrons stored in the floating gate FG of each of the memory transistors escape toward the substrate by an FN tunnel current. As a result, information stored in all the memory cells 21A, 21B, 21C and 21D are collectively erased.

Furthermore, the information may be erased divisionally for each word line. Specifically, all the bit lines BL1 and BL2 and the source line S are brought into an open state, and a voltage of 10 V is applied to the substrate line SUB, a voltage of 0 V is applied to the word line WL1 to which the memory cells 21A and 21B for erasing information are connected, and a voltage of 10 V is applied to the word line WL2 to which the non-selected memory cells 21C and 21D are connected, only information stored in the memory cells 21A and 21B arranged along the word line WL1 are erased.

[Reading]

FIG. 6 is a diagram of an equivalent circuit showing situations where voltages are applied to the non-volatile memory at the time of reading.

For example, it is assumed that information stored in the memory cell 21A is read out. First, a voltage of 2 V is applied to the source line S by the source control circuit, and a voltage of 0 V is applied to the substrate line SUB by the substrate control circuit. A sense voltage of 5 V is applied to the word line WL1 to which the memory cell 21A for reading out information is connected by the row decoder, and a voltage of 0 V is applied to the bit line BL1 to which the selected memory cell 21A is connected by the column decoder so as to select the memory cell 21A. On the other hand, a voltage of 0 V is applied to the word line WL2 to which the non-selected memory cells 21C and 21D are connected by the row decoder, and the bit line BL2 to which the non-selected memory cells 21B and 21D are connected is brought into an open state by the column decoder.

If information is written to the selected memory cell 21A, therefore, no conduction occurs between the source and the drain of the memory transistor 20A, so that no channel is formed. That is, no cell current flows through the selected memory cell 21A. On the other hand, if the selected memory cell 21A is in a state where information is erased, conduction occurs between the source and the drain of the memory transistor 20A, so that a channel is formed. That is, a cell current flows through the selected memory cell 21A. If the cell current is sensed by the sense amplifier, information stored in the selected memory cells 21A and 21B can be read out.

A gate voltage required to cause conduction between the source and the drain thus differs depending on a state where electrons are stored in the floating gate and a state where no electrons are stored therein. Specifically, a voltage for causing conduction between the source and the drain takes a high value V1 (for example, 7 V) in a state where electrons are injected into the floating gate, while taking a low value V2 (for example, 1 V) in a state where no electrons are injected thereinto. Accordingly, a suitable sense voltage $V_{TH}$ (for example, 5 V) is set, thereby to make it possible to read out binary data "0" or "1" from the memory cell.

Information may be read out divisionally for each word line. Specifically, a voltage of 5 V is applied to the source line S, a voltage of 0 V is applied to all the bit lines BL1 and BL2 and the substrate line SUB, and a sense voltage of 2 V is applied to the word line WL1, information stored in the memory cells 21A and 21B arranged along the word line WL1 are read out.

Figure 8A:
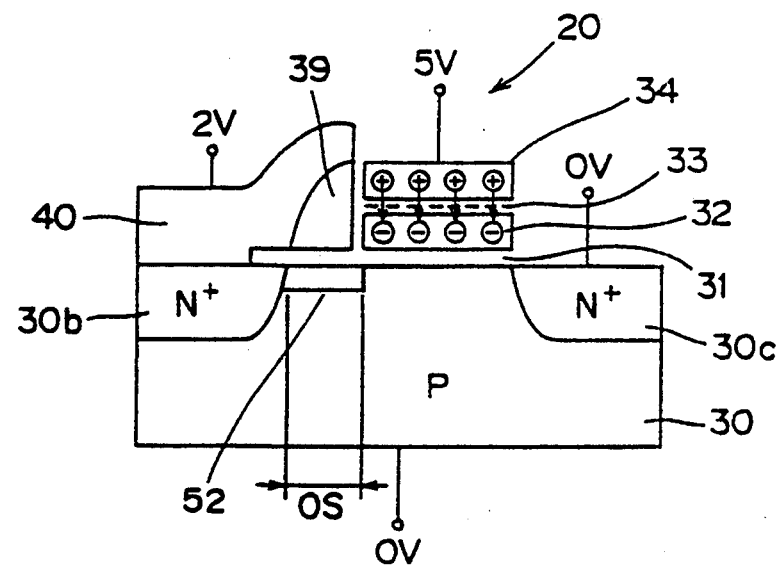
FIGS. 8A and 8B are diagrams showing the principle of an operation of the non-volatile memory device at the time of reading.
Figure 8B:
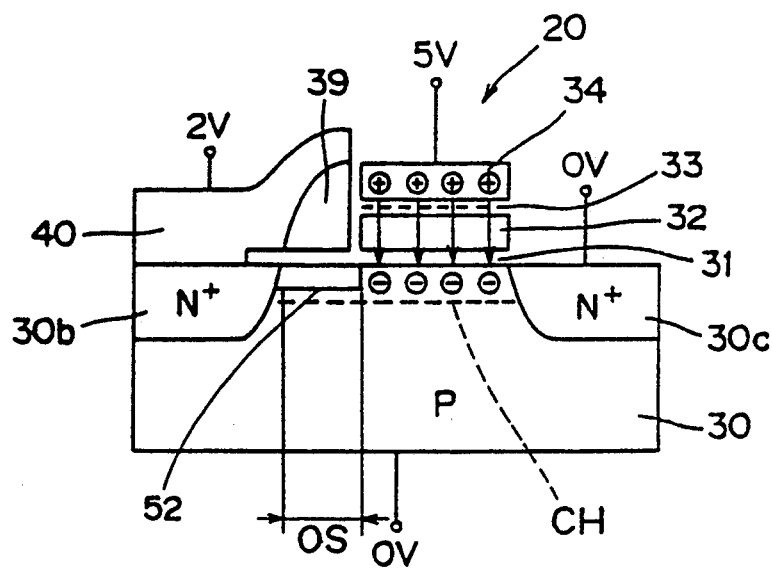
Figure 9:
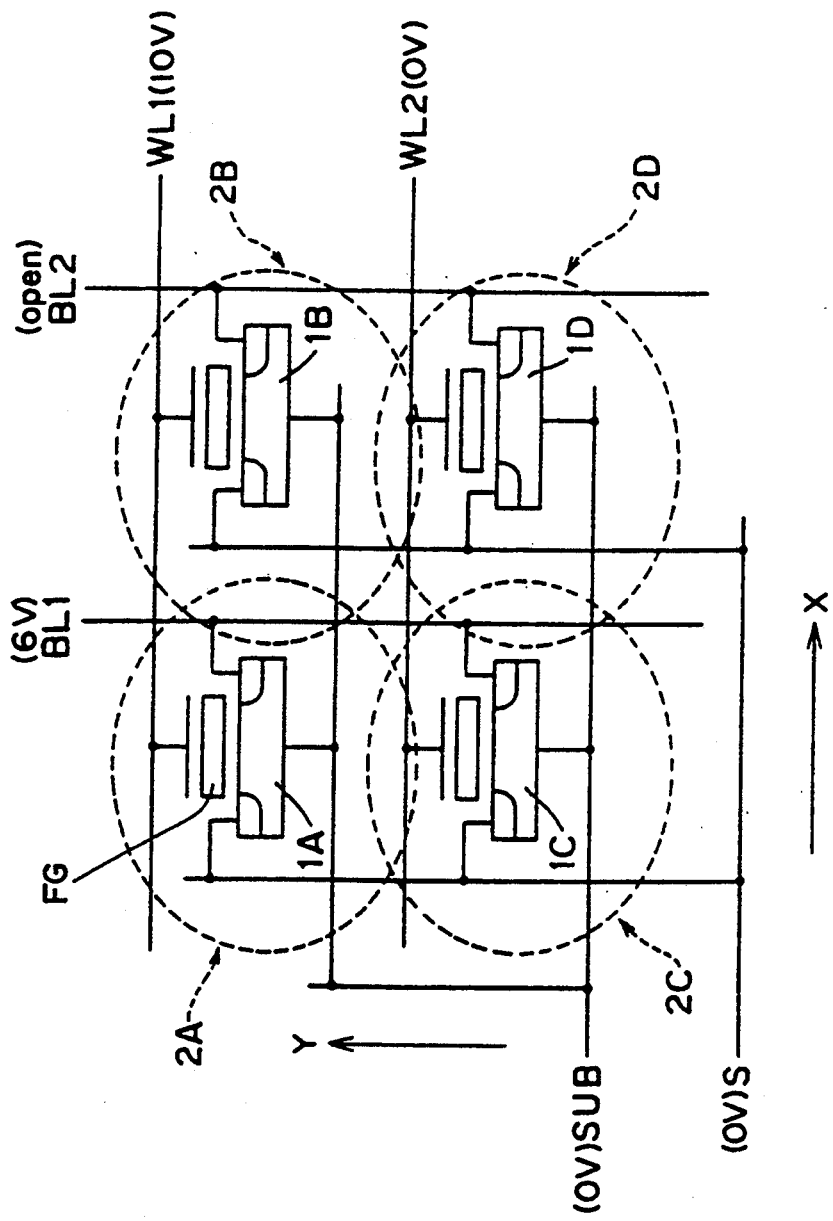
FIG. 9 is a diagram of an equivalent circuit showing the electrical construction of a conventional non-volatile memory.
Figure 10:
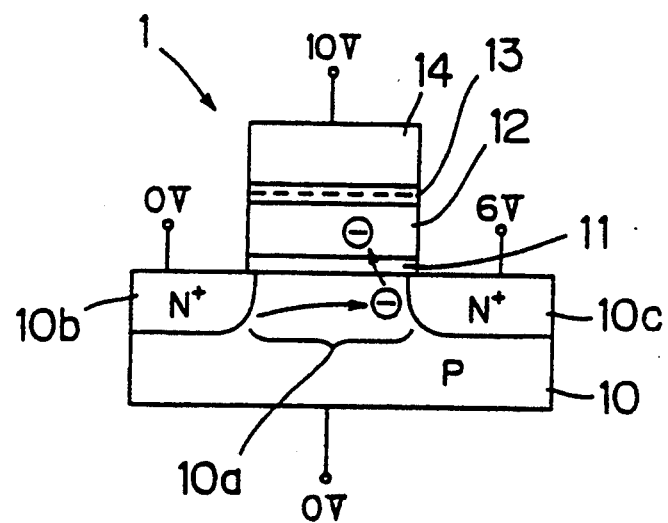
FIG. 10 is a schematic cross sectional view showing the construction of a conventional non-volatile memory device.
Figure 11:
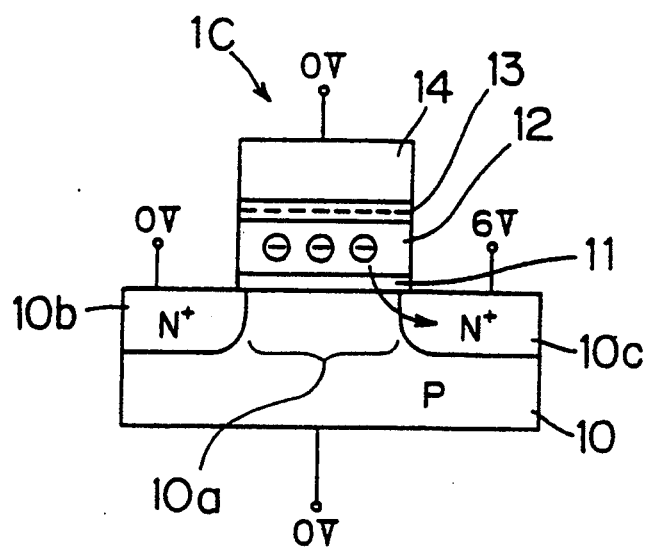
FIG. 11 is a diagram showing a drain disturbance at the time of writing.
Figure 12:
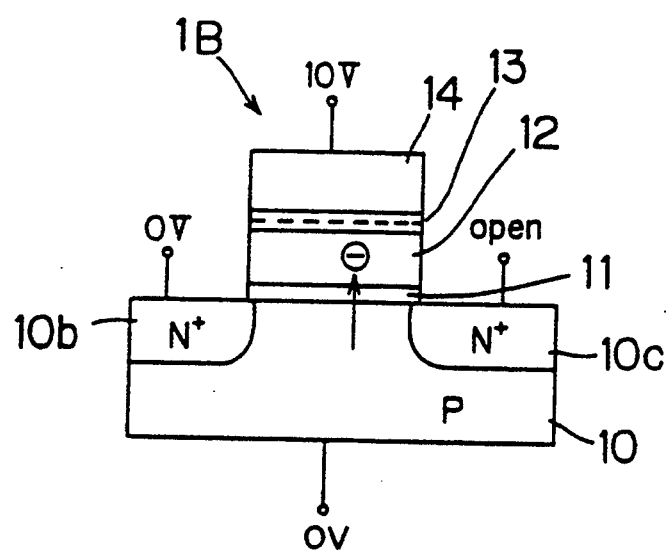
FIG. 12 is a diagram showing a gate disturbance at the time of writing.

Description is now made of operations of the memory transistors at the time of reading out information with reference to FIGS. 8A and 8B. As shown in FIGS. 8A and 8B, a voltage of 0 V is applied to the drain region 30c and the substrate 30 of the memory transistor 20 in the selected memory cell, a voltage of 2 V is applied to the source region 30b thereof, and a sense voltage of 5 V is applied to the control gate 34 thereof, so that the offset region OS immediately under the sidewall gate 39 is inverted, to form an inversion layer 52.

At this time, in an information written state where electrons are stored in the floating gate 32 as shown in FIG. 8A, the effect of positive charges in the control gate 34 is blocked by the electrons stored in the floating gate 32, not to be exerted on the surface of the substrate 30 immediately under the floating gate 32. Therefore, no conduction occurs between the source region 30b and the drain region 30c, so that no channel is formed. That is, no current flows through the memory transistor 20.

On the other hand, in an information erased state where no electrons are stored in the floating gate 32 as shown in FIG. 8B, the effect of positive charges in the control gate 34 is exerted on the surface of the substrate 30 immediately under the floating gate 32. Consequently, electrons having a concentration equal to the hole concentration of the substrate 30 are induced on the surface of the substrate 30, resulting in inversion. The electrons induced by the inversion are connected to the inversion layer 52 of the offset region OS. As a result, conduction occurs between the source region 30b and the drain region 30c, so that a channel CH is formed. That is, a current flows through the memory transistor 20.

Since information is thus read out utilizing the inversion of the offset region OS, the read speed becomes as high as that of a flash memory.

Since the FN tunnel current is produced between the substrate and the gate and information is rewritten by the FN tunnel current, the tunnel oxide film can be prevented from being degraded, thereby to make it possible to increase the number of times of rewritability as well as to instantaneously rewrite information.

Although in the above described embodiment, description was made of an example using a P-type silicon substrate, the memory transistor may be of a P-channel type using an N-type silicon substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
   a semiconductor substrate of a predetermined first conductivity type;
   a source region and a drain region of a second conductivity type opposite to said first conductivity type, which are formed spaced apart from each other by a predetermined distance on a surface layer of said semiconductor substrate;
   a tunnel insulation film interposed between said source region and said drain region having such a thickness that charges produced in a channel region so formed as to be able to pass therethrough by tunneling, which is formed spaced apart from said source region by a predetermined offset distance on the channel region;

a floating gate formed on said tunnel insulation film for storing the charges which passed through the tunnel insulation film by tunneling;

a capacitor insulation film formed on said floating gate for trapping the charges stored in the floating gate so as not to escape;

a control gate formed on said capacitor insulation film, to which a predetermined control voltage is applied;

a sidewall gate formed above the remaining channel region on the side of the source region where said tunnel insulation film is not formed; and insulating means for insulating said sidewall gate from the channel region, the floating gate, the capacitor insulation film and the control gate.

2. The non-volatile semiconductor memory device according to claim 1, wherein said semiconductor substrate of the first conductivity type is a P-type silicon substrate, and said source region and said drain region are of an N-type.

3. The non-volatile semiconductor memory device according to claim 2, wherein said tunnel insulation film is composed of $SiO_2$.

4. The non-volatile semiconductor memory device according to claim 3, wherein said capacitor insulation film has an OXIDE-NITRIDE-OXIDE structure in which an $Si_3N_4$ film is sandwiched between upper and lower $SiO_2$ films.

5. The non-volatile semiconductor memory device according to claim 1, wherein said insulating means has such a thickness that charges produced in said channel region do not pass therethrough by FN tunneling.

6. A non-volatile memory circuit comprising a plurality of transistors formed in a matrix in the column direction and the row direction on a semiconductor substrate of a first conductivity type, each of said transistors having a structure comprising a source and a drain of a second conductivity type opposite to said first conductivity type, which are formed spaced apart from each other by a predetermined distance on a surface layer of said semiconductor substrate, a tunnel insulation film interposed between said source and said drain having such a thickness that charges produced in a channel region so formed as to be able to pass therethrough by tunneling, which is formed spaced apart from said source by a predetermined offset distance on the channel region, a floating gate formed on said tunnel insulation film for storing the charges which passed through the tunnel insulation film by tunneling, a capacitor insulation film formed on said floating gate for trapping the charges stored in the floating gate so as not to escape, a control gate formed on said capacitor insulation film, to which a predetermined control voltage is applied, a sidewall gate formed above the remaining channel region on the side of the source region where said tunnel insulation film is not formed, and insulating means for insulating said sidewall gate from the channel region, the floating gate, the capacitor insulation film and the control gate, a common word line being connected to respective control gates of the plurality of transistors arranged in the column direction for each column, a common bit line being connected to respective drains of the plurality of transistors arranged in the row direction for each row, a common source line being connected to respective sources of all the transistors, and a common substrate line connected to all the transistors being provided below the transistors.

7. The non-volatile memory circuit according to claim 6, wherein in each of said transistors, the insulating means for insulating the sidewall gate from the channel region, the floating gate, the capacitor insulation film and the control gate has such a thickness that the charges produced in the channel region do not pass therethrough by FN tunneling.

8. The non-volatile memory circuit according to claim 7, wherein the capacitor insulation film of each of said transistors has an OXIDE-NITRIDE-OXIDE structure in which an $Si_3N_4$ film is sandwiched between upper and lower $SiO_2$ films.

* * * * *